(12) United States Patent
Lerner et al.

(10) Patent No.: US 6,218,874 B1
(45) Date of Patent: Apr. 17, 2001

(54) ONE-SHOT PULSE SYNCHRONIZER

(75) Inventors: Abner Lerner, Apple Valley; Michael F. Maas, West St. Paul, both of MN (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/327,835

(22) Filed: Jun. 8, 1999

(51) Int. Cl.[7] ........................................................ H03L 7/00
(52) U.S. Cl. ........................ 327/145; 327/146; 327/172; 327/144
(58) Field of Search ........................... 327/144, 142, 327/145, 146, 154, 172

(56) References Cited

U.S. PATENT DOCUMENTS

| 4,797,585 | 1/1989 | Segawa et al. | 327/172 |
|---|---|---|---|
| 4,843,255 | 6/1989 | Stuebing | 327/230 |
| 4,894,791 | 1/1990 | Jiang et al. | 327/393 |
| 4,935,942 | * 6/1990 | Hwang et al. | 375/106 |
| 5,343,085 | 8/1994 | Fujimoro et al. | 327/143 |
| 5,396,110 | 3/1995 | Houston | 327/172 |
| 5,420,467 | 5/1995 | Huott et al. | 327/174 |
| 5,428,311 | 6/1995 | McClure | 327/276 |
| 5,467,053 | 11/1995 | Wuidart et al. | 327/551 |
| 5,933,032 | 8/1999 | Shah et al. | 327/34 |

FOREIGN PATENT DOCUMENTS

| 62-261215 | 11/1987 | (JP) | H03K/3/033 |
|---|---|---|---|
| 5-206797 | 8/1993 | (JP) | H03K/5/04 |

* cited by examiner

*Primary Examiner*—Kenneth B. Wells
*Assistant Examiner*—Cassandra Cox
(74) *Attorney, Agent, or Firm*—Christopher P. Mairoana, P.C.

(57) ABSTRACT

An apparatus comprising a memory section and a first circuit. The memory section may be configured to present a first output in response to (i) a first clock signal, (ii) a second clock signal, (iii) an input pulse and (iv) the first output. The first circuit may be configured to generate a second output in response to (i) the first output and (ii) the second clock signal, where the second output may comprise a pulse having a width equal to a period of the second clock signal. In one example, an input circuit may be configured to present the first output to the memory section in response to the input pulse and a first feedback of the output.

18 Claims, 3 Drawing Sheets

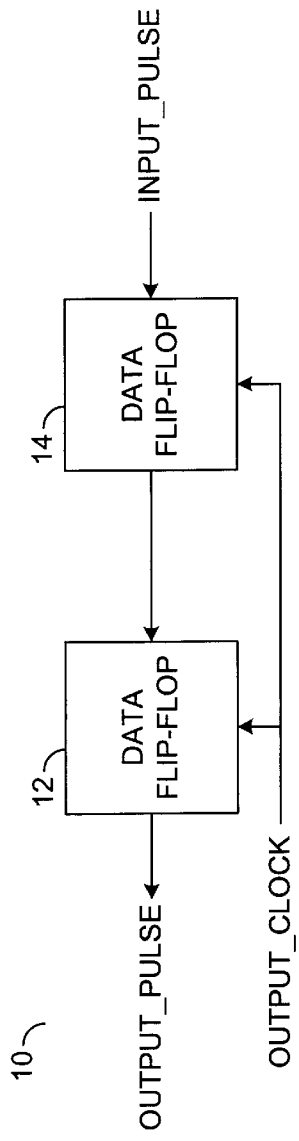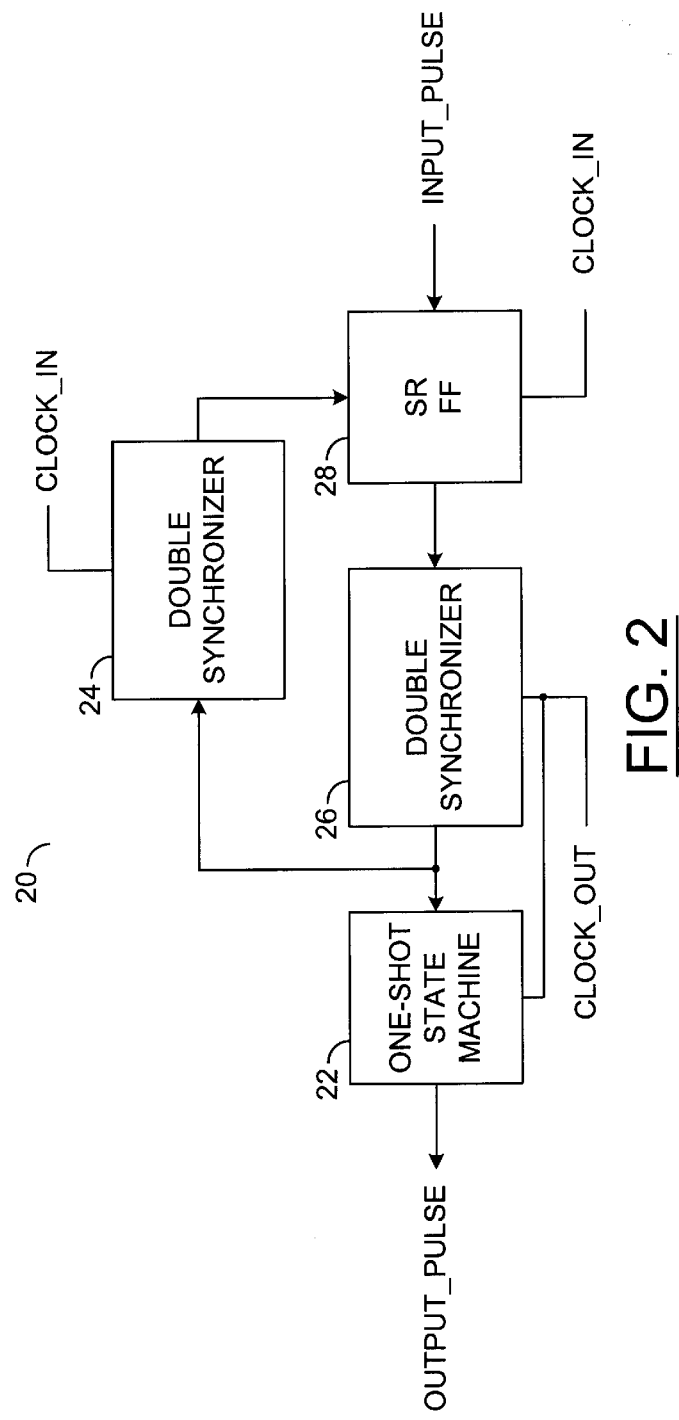

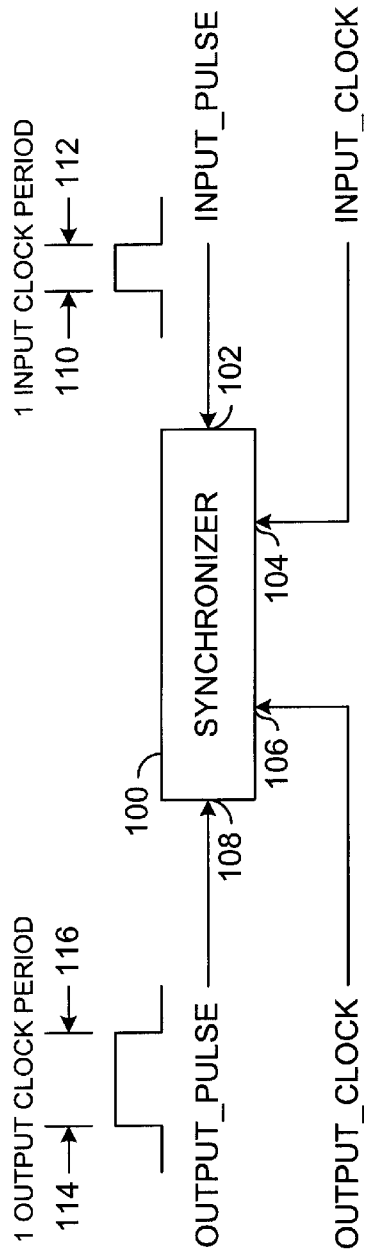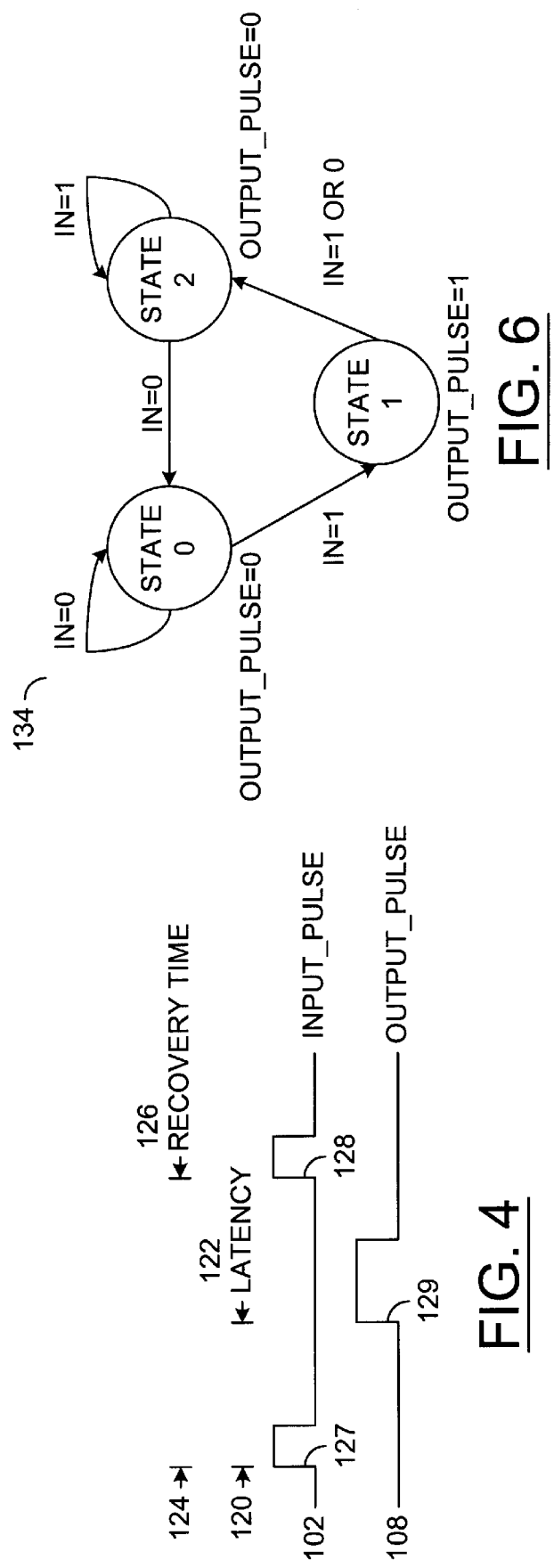

ONE-SHOT PULSE SYNCHRONIZER

FIELD OF THE INVENTION

The present invention relates to synchronizing circuits generally and, more particularly, to a circuit and/or method that may synchronize a one-shot pulse signal to a different clock domain.

BACKGROUND OF THE INVENTION

A conventional implementation of a synchronizer 10 involves the utilization of a flip-flop 12 and a flip-flop 14 in a cascaded configuration, as shown in FIG. 1. The flip-flops 12 and 14 attempt to reduce the probability of metastable behavior of the synchronized signal. For the cases when the frequency of the input clock signal is higher than that of the output clock signal, there is a risk that short input pulses may be missed by the flip-flop 12, thus being filtered by the synchronization logic.

Some of the undesirable behavior of the synchronizer 10 of FIG. 1 can be avoided by implementing an SR flip-flop in the input clock domain, along with additional feedback logic. FIG. 2 illustrates such an architecture 20 including a one-shot state machine 22, a double synchronizer 24, a double synchronizer 26 and a SR flip-flop 28. The SR flip-flop 28 and the double synchronizer 24 are clocked by a signal CLOCK_IN. The double synchronizer 26 is clocked by a signal CLOCK_OUT. The double synchronizers 24 and 26 can each contain the circuitry of the synchronizer 10 of FIG. 1 and are implemented in both the feed-forward and feedback paths.

The circuit 20 has a high latency and recovery time due to the implementation of the two double synchronizers 24 and 26. In addition, the circuit 20 requires a relatively large number of storage elements, which increases the implementation area and overall power consumed.

SUMMARY OF THE INVENTION

The present invention concerns an apparatus comprising a memory section and a first circuit. The memory section may be configured to present a first output in response to (i) a first clock signal, (ii) a second clock signal, (iii) an input pulse and (iv) the first output. The first circuit may be configured to generate a second output in response to (i) the first output and (ii) the second clock signal, where the second output may comprise a pulse having a width equal to a period of the second clock signal. In one example, an input circuit may be configured to present the first output to the memory section in response to the input pulse and a first feedback of the output.

The objects, features and advantages of the present invention include providing a synchronizing circuit that may (i) reliably capture and report a one-shot pulse signal generated in a different clock domain, (ii) minimize the latency (or propagation delay) of the pulse signal through the synchronizing circuit by reducing the number of flip-flops in the forward path, (iii) maximize the rate at which the incoming pulses may arrive and still be able to be captured, (iv) minimize the number of elements required for the implementation, (v) provide an implementation that may be easily tested, (vi) eliminate synchronization logic in the is feedback path, (vii) reduce recovery time, (viii) be implemented without a clock and/or asynchronous reset signal gating, and/or (ix) be implemented with a minimum number of flip-flops.

BRIEF DESCRIPTION OF THE DRAWINGS

These and other objects, features and advantages of the present invention will be apparent from the following detailed description and the appended claims and drawings in which:

FIG. 1 illustrates a conventional synchronizer;

FIG. 2 illustrates a conventional one-shot synchronizer;

FIG. 3 illustrates a block diagram of a synchronizer circuit in accordance with a preferred embodiment of the present invention;

FIG. 4 illustrates a signal diagram outlining the latency parameter;

FIG. 6 illustrates an example of the state machine of FIG. 5.

DETAILED DESCRIPTION OF THE PREFERRED EMBODIMENTS

Figure 5:
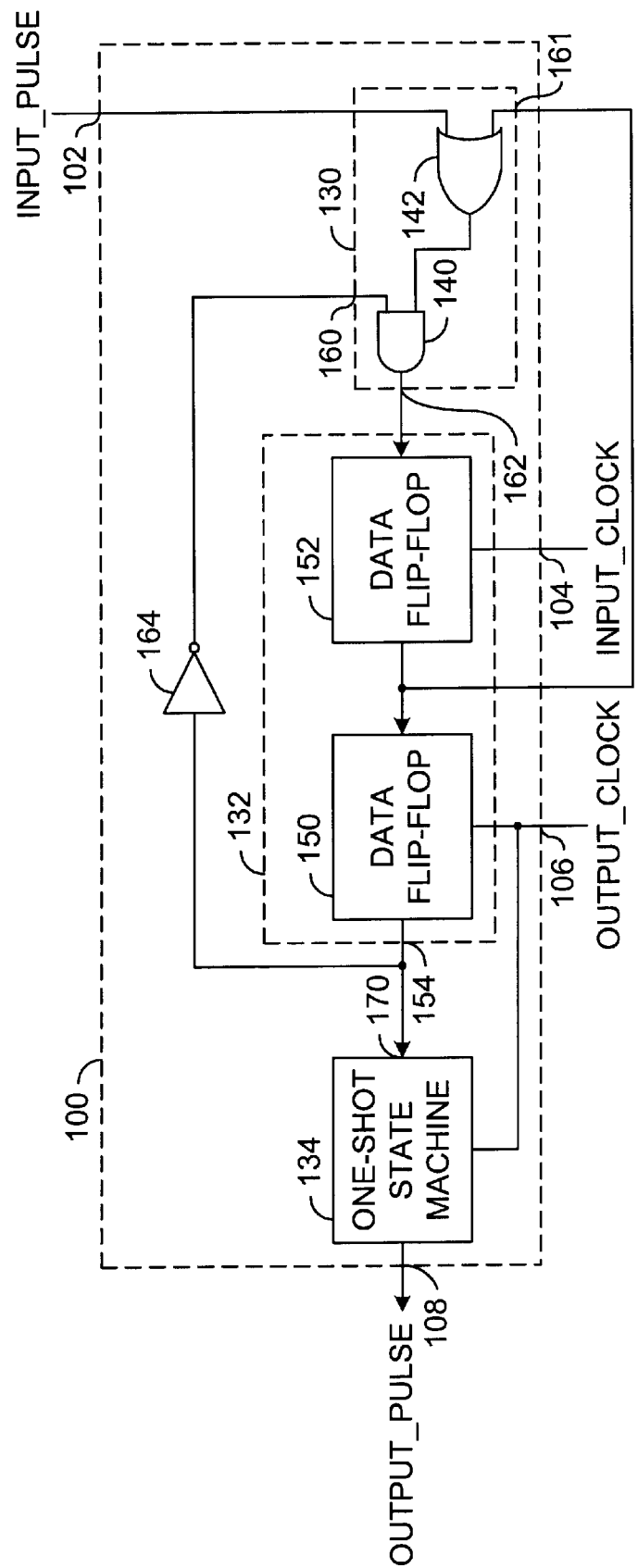
FIG. 5 illustrates an example of a preferred embodiment of the present invention.

Referring to FIG. 3, a block diagram of a synchronizer 100 is shown in accordance with a preferred embodiment of the present invention. The synchronizer 100 generally comprises an input 102, an input 104, an input 106 and an output 108. The input 102 may receive a signal (e.g., INPUT_PULSE) synchronized to the input 104. The input 104 may receive a clock signal (e.g., INPUT_CLOCK). The input 106 may receive a clock signal (e.g., OUTPUT_CLOCK). The output 108 may present a signal (e.g., OUTPUT_PULSE) synchronized to the input 106. The signal INPUT_CLOCK and the signal OUTPUT_CLOCK generally have a different period/frequency. The signal INPUT_PULSE presented to the input 102 may be a pulse that may have a pulsewidth equal to the period of the signal INPUT_CLOCK. The pulsewidth of the signal INPUT_PULSE is generally the distance between the vertical line 110 and the vertical line 112. Similarly, the signal OUTPUT_PULSE presented at the output 108 may be a pulse that has a pulsewidth defined by the distance between the vertical line 114 and the vertical line 116. The pulsewidth of the signal OUTPUT_PULSE is generally equal to the period of the signal OUTPUT_CLOCK received at the input 106.

Referring to FIG. 4, a timing diagram illustrating the latency parameter and the recovery time parameter of the circuit 100 is shown. The distance (or time) between the vertical line 120 and the vertical line 122 generally defines the latency parameter. The distance (or time) between the vertical line 124 and the vertical line 126 generally defines the recovery time parameter. The latency parameter is generally defined as the difference between 120 (the rising edge 127 of the signal INPUT_PULSE) and 122 (the rising edge of the signal OUTPUT_PULSE). The recovery time parameter is generally the difference between the rising edge 127 of the signal INPUT_PULSE and the next rising edge 128 of the signal INPUT_PULSE.

Latency is generally the time that it takes the synchronizer 100 to assert the signal OUTPUT_PULSE in response to the positive edge of the signal INPUT_PULSE. Recovery time is generally defined as the minimum time that it takes the synchronizer 100 to accept and recognize a new signal INPUT_PULSE at the input 102 from the positive edge of the previous signal INPUT_PULSE.

Referring to FIG. 5, a more detailed diagram of the synchronizer 100 is shown. The synchronizer 100 generally comprises an input section 130, a memory section 132 and an output section 134. The output section 134 may be implemented, in one example, as a state machine. In another example the output section 134 may be implemented as a one-shot state machine. The input section 130 generally comprises a first gate 140 and a second gate 142. In one example, the gate 140 may be implemented as an AND gate and the gate 142 may be implemented as a OR gate. However, other logic variations of the gate 140 and the gate 142 may be implemented accordingly to meet the design criteria of a particular implementation.

The memory section 132 generally comprises a first memory element 150 and a second memory element 152. The memory elements 150 and 152 may be implemented as flip-flops. In one example, the flip-flops may be D-type flip-flops. However, other flip-flops, such as SR-type flip-flops and/or JK-type flip-flops may be implemented accordingly to meet the design criteria of a particular implementation. The memory element 152 generally receives the signal INPUT_CLOCK and the memory element 150 generally receives the signal OUTPUT_CLOCK.

The input section 130 generally receives the signal INPUT_PULSE at the input 102 and a feedback from the memory section 132 at an input 160. In one example, the input section 130 may receive a second feedback at an input 161. The memory section 132 generally presents a signal at an output 154. The input section 130 generally presents a signal at an output 162. The feedback signal received at the input 160 may, in one example, be inverted by an inverter 164. In one example, the signal presented to the input 160 may be an asynchronous signal. The state machine 134 generally has an input 170 that may receive the signal from the output 154. The state machine 134 generally presents the signal OUTPUT_PULSE at the output 108.

The synchronizer 100 may eliminate synchronization logic in the feedback path. The memory element 150 may be prone to metastability issues if implemented alone. However, since the output of the memory element 150 is generally connected to the input of the state machine 134, the metastable states may be minimized.

If the initial state of the memory elements 150 and 152 is "0", an incoming signal INPUT_PULSE is generally registered by the memory element 152. The memory element 152 may be set and may transmit the event to the memory element 150. Since the memory element 150 is generally clocked by the signal OUTPUT_CLOCK, the memory element 150 may become metastable due to the asynchronous nature of the signal INPUT_PULSE. Once the output of the memory element 150 gets asserted, the state machine 134 may be triggered and may send a reset signal to memory element 152, thereby acknowledging the reception of the signal INPUT_PULSE. The memory element 152 may then become metastable, but will generally get reset, triggering a reset condition on the memory element 150. The reset condition generally completes the cycle, and may cause the state machine 134 to go back to the reset state.

Referring to FIG. 6, the operation of the state machine 134 is shown comprising a STATE0, a STATE1 and a STATE2. In STATE0, the state machine 134 generally waits for the output of the memory element 150 to get asserted. Once this occurs, the state machine 134 may enter the STATE1 and the output of the state machine 134 gets asserted. Since the output of the state machine 134 is not directly dependent on the signal received at the input 170, the state machine 134 inherently avoids metastability issues. The next clock cycle may unconditionally bring the state machine 134 to State2, where the state machine 134 waits for the signal at the input 170 to clear. Once this condition is met, the state machine 134 generally resets to STATE0, waiting again for the input 170 to get asserted. A one clock cycle output signal may be generated, since the state machine 134 only stays in STATE1 for one clock cycle.

The synchronizer 100 may reduce the number of memory elements needed for implementation, which may decrease the total power consumption, the latency and the recovery time. An expression for the worst case latency of the synchronizer 100 may be (Tckin+2*Tckout). An expression for the worst-case recovery time may be (2*Tckin+2*Tckout), where Tckin is the period of the signal INPUT_CLOCK and Tckout is the period of the signal OUTPUT_CLOCK.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a memory circuit configured to present a first output in response to (i) a first clock signal having a first frequency, (ii) a second clock signal having a second frequency different than said first frequency, and (iii) a first input; and
   a first circuit configured to generate a second output in response to (i) said first output and (ii) said second clock signal, wherein said second output comprises a pulse having a width equal to a period of said second clock signal.

2. The apparatus according to claim 1, further comprising:
   an input circuit configured to present said first input to said memory circuit in response to an input pulse and a first feedback signal of the first output.

3. The apparatus according to claim 2, wherein said input circuit presents said first input in further response to a second feedback signal and said memory circuit is configured to present said second feedback signal.

4. The apparatus according to claim 1, wherein metastability is prevented.

5. The apparatus according to claim 1, wherein said first circuit comprises a state machine and is configured to receive the second clock signal.

6. The apparatus according to claim 1, wherein said memory circuit comprises a first and a second memory element, where the first memory element is configured to receive the first clock signal and the second memory element is configured to receive the second clock signal.

7. The apparatus according to claim 6, wherein said first and second memory elements comprise flip-flops.

8. The apparatus according to claim 7, wherein said first clock signal comprises an input clock signal and said second clock signal comprises an output clock signal.

9. The apparatus according to claim 3, wherein said memory circuit comprises a first and a second memory element, where:
   the first memory element is configured to receive (i) the first clock signal and (ii) the first input signal; and
   the second memory element is configured to receive (i) the second clock signal and (ii) an output of the first memory element.

10. The apparatus according to claim 2, wherein said first feedback signal is synchronous to said second clock signal and said second feedback is synchronous to said first clock signal.

11. The apparatus according to claim 3, wherein said input section is configured to logically combine said second feedback signal with at least one of the input pulse, the first feedback and/or a logical combination thereof.

12. An apparatus comprising:
   means for generating a first output in response to (i) a first clock signal having a first frequency, (ii) a second clock signal having a second frequency different than said first frequency, and (iii) an input pulse; and means for generating a second output in response to (i) said first output and (ii) said second clock signal, wherein said second output comprises a pulse having a width equal to a period of said second clock signal.

13. A method for synchronizing an input pulse with clock signal comprising the steps of:

(A) generating a first output in response to (i) a first clock signal having a first frequency, (ii) a second clock signal having a second frequency different than said first frequency, and (iii) a first input; and (B) generating a second output in response to (i) said first output and (ii) said second clock signal, wherein said second output comprises a pulse having a width equal to a period of said second clock signal.

14. The method according to claim 13, further comprising the step of:

(C) presenting said first input in response to (i) an input pulse and (ii) a first feedback signal of the first output.

15. The method according to claim 14, wherein step (C) presents said first input in further response to a second feedback signal and said second feedback signal is generated in response to said first input and said first clock signal.

16. The method according to claim 13, wherein said first clock signal comprises an input clock signal and said second clock signal comprises an output clock signal.

17. The method according to claim 15, wherein said first feedback signal is synchronous to said second clock signal and said first feedback is synchronous to said second clock signal.

18. The method according to claim 15, further comprising the step of:

logically combining said second feedback with at least one of the input pulse, the first feedback and/or a logical combination thereof.

* * * * *